(12) United States Patent
Schwarz et al.

(10) Patent No.: US 11,177,248 B2
(45) Date of Patent: Nov. 16, 2021

(54) LIGHT-EMITTING COMPONENT, DISPLAY DEVICE AND METHOD FOR MANUFACTURING A DISPLAY DEVICE

(71) Applicant: OSRAM OLED GmbH, Regensburg (DE)

(72) Inventors: Thomas Schwarz, Regensburg (DE); Frank Singer, Regenstauf (DE)

(73) Assignee: OSRAM OLED GMBH, Regensburg (DE)

(*) Notice: Subject to any disclaimer, the term of this patent is extended or adjusted under 35 U.S.C. 154(b) by 0 days.

(21) Appl. No.: 16/753,809

(22) PCT Filed: Sep. 25, 2018

(86) PCT No.: PCT/EP2018/076013
§ 371 (c)(1),
(2) Date: Apr. 6, 2020

(87) PCT Pub. No.: WO2019/068523
PCT Pub. Date: Apr. 11, 2019

(65) Prior Publication Data
US 2020/0286873 A1    Sep. 10, 2020

(30) Foreign Application Priority Data
Oct. 6, 2017  (DE) ............. 10 2017 123 290.7

(51) Int. Cl.
*H01L 25/16*  (2006.01)
*H01L 21/683*  (2006.01)
(Continued)

(52) U.S. Cl.
CPC ........ *H01L 25/167* (2013.01); *H01L 21/6835* (2013.01); *H01L 22/12* (2013.01);
(Continued)

(58) Field of Classification Search
CPC ... H01L 25/167; H01L 21/6835; H01L 22/12; H01L 25/0753; H01L 33/62;
(Continued)

(56) References Cited

U.S. PATENT DOCUMENTS 5,647,034 A * 7/1997 Matsuda ............... H01L 31/167
                                                 257/82
8,669,580 B2 * 3/2014 Morsheim ............ H01L 24/97
                                                 257/99
(Continued)

FOREIGN PATENT DOCUMENTS

DE    102012112302 A1    6/2014
DE    102014105734 A1    10/2015
(Continued)

OTHER PUBLICATIONS

Kingbright, "0.65x0.65mm Full-Color Surface Mount LED", Aug. 31, 2015, pp. 1-6.
(Continued)

*Primary Examiner* — Vu A Vu
(74) *Attorney, Agent, or Firm* — Viering, Jentschura & Partner MbB

(57) ABSTRACT

A light-emitting component may include an IC chip and an LED chip arranged on a top surface of the IC chip and electrically coupled thereto. The LED chip may be electrically controllable by means of the IC chip. The IC chip may have at least two electrical connecting surface on a bottom surface remote from the LED chip. The light-emitting component is electrically contactable and operable by means of the connecting surfaces.

17 Claims, 8 Drawing Sheets

(51) Int. Cl.
*H01L 21/66* (2006.01)
*H01L 25/075* (2006.01)
*H01L 33/62* (2010.01)

(52) U.S. Cl.
CPC .......... *H01L 25/0753* (2013.01); *H01L 33/62* (2013.01); *H01L 2221/68354* (2013.01); *H01L 2221/68363* (2013.01); *H01L 2933/0066* (2013.01)

(58) Field of Classification Search
CPC . H01L 2221/68354; H01L 2221/68363; H01L 2933/0066; H01L 25/16; H01L 33/486
USPC .......................................................... 257/89
See application file for complete search history.

(56) References Cited

U.S. PATENT DOCUMENTS

| | | | |
|---|---|---|---|
| 9,461,027 B2 | 10/2016 | Schug | |
| 10,047,928 B2* | 8/2018 | Chen | F21V 31/005 |
| 2004/0121525 A1* | 6/2004 | Chopra | H01L 23/53276 438/142 |
| 2005/0233504 A1 | 10/2005 | Masato et al. | |
| 2013/0126098 A1 | 5/2013 | Bibl et al. | |
| 2013/0126827 A1 | 5/2013 | Bibl et al. | |
| 2013/0128585 A1 | 5/2013 | Bibl et al. | |
| 2013/0210194 A1 | 8/2013 | Bibl et al. | |
| 2014/0008813 A1 | 1/2014 | Golda et al. | |
| 2014/0048909 A1 | 2/2014 | Golda et al. | |
| 2014/0061687 A1 | 3/2014 | Hu et al. | |
| 2014/0084482 A1 | 3/2014 | Hu et al. | |
| 2014/0158415 A1 | 6/2014 | Golda et al. | |
| 2014/0159043 A1 | 6/2014 | Sakariya et al. | |
| 2014/0159064 A1 | 6/2014 | Sakariya et al. | |
| 2014/0159065 A1 | 6/2014 | Hu et al. | |
| 2014/0159066 A1 | 6/2014 | Hu et al. | |
| 2014/0159067 A1 | 6/2014 | Sakariya et al. | |
| 2014/0159324 A1 | 6/2014 | Golda et al. | |
| 2014/0168037 A1 | 6/2014 | Sakariya et al. | |
| 2014/0169924 A1 | 6/2014 | Golda et al. | |
| 2014/0169927 A1 | 6/2014 | Golda et al. | |
| 2014/0196851 A1 | 7/2014 | Golda et al. | |
| 2014/0209248 A1 | 7/2014 | Golda et al. | |
| 2014/0241843 A1 | 8/2014 | Golda et al. | |
| 2014/0241844 A1 | 8/2014 | Golda et al. | |
| 2014/0267683 A1 | 9/2014 | Bibl et al. | |
| 2014/0340900 A1 | 11/2014 | Bathurst et al. | |
| 2015/0021466 A1 | 1/2015 | Bibl et al. | |
| 2015/0028362 A1 | 1/2015 | Chan et al. | |
| 2015/0076528 A1 | 3/2015 | Chan et al. | |
| 2015/0179876 A1 | 6/2015 | Hu et al. | |
| 2015/0179877 A1 | 6/2015 | Hu et al. | |
| 2015/0187740 A1 | 7/2015 | McGroddy et al. | |
| 2015/0187991 A1 | 7/2015 | McGroddy et al. | |
| 2015/0235121 A1 | 8/2015 | Pavate et al. | |
| 2015/0263066 A1 | 9/2015 | Hu et al. | |
| 2015/0321338 A1 | 11/2015 | Parks et al. | |
| 2015/0325598 A1 | 11/2015 | Pfeuffer et al. | |
| 2015/0333221 A1 | 11/2015 | Bibl et al. | |
| 2015/0348504 A1 | 12/2015 | Sakariya et al. | |
| 2015/0349137 A1 | 12/2015 | Higashi et al. | |
| 2016/0133496 A1 | 5/2016 | Lambert et al. | |
| 2016/0155891 A1 | 6/2016 | Moosburger et al. | |
| 2017/0133356 A1 | 5/2017 | Mercier et al. | |
| 2017/0187976 A1 | 6/2017 | Cok | |
| 2017/0243860 A1* | 8/2017 | Hong | H01L 24/13 |
| 2017/0256522 A1* | 9/2017 | Cok | H01L 27/3255 |
| 2018/0247922 A1* | 8/2018 | Robin | H01L 33/32 |
| 2018/0287026 A1 | 10/2018 | Richter | |

FOREIGN PATENT DOCUMENTS

| | | |
|---|---|---|
| DE | 102015116855 A1 | 4/2017 |
| DE | 102016103328 A1 | 8/2017 |
| WO | 2014024082 A2 | 2/2014 |
| WO | 2017089676 A1 | 6/2017 |

OTHER PUBLICATIONS

Everlight Americas, "SMD EAST0505RGBA0", Data Sheet, Jun. 11, 2015, pp. 1-12, Everlight Americas Inc.
OSRAM Opto Semiconductors, "Multi CHIPLED Datasheet Version 1.0 LTRB RASF", Jan. 26, 2015, pp. 1-23, OSRAM Opto Semiconductors GmbH, Regensburg, Germany.
Prevatte, C. et al., "Miniature Heterogeneous Fan-Out Packages for High-Performance, Large-Format Systems", 017 IEEE 67th Electronic Components and Technology Conference (ECTC), May 30, 2017, 9 pages; 2, Orlando, FL, USA.
German search report issued for the corresponding DE application No. 10 2017 126 338.1, dated Jul. 31, 2018, 10 pages (for informational purposes only).
International Search Report based on Application No. PCT/EP2018/076013, dated Nov. 21, 2018, 15 pages (for reference purpose only).
German Search Report based on Application No. DE 10 2017 123 290.7, dated Mar. 22, 2018, 8 pages (for reference purpose only).

* cited by examiner

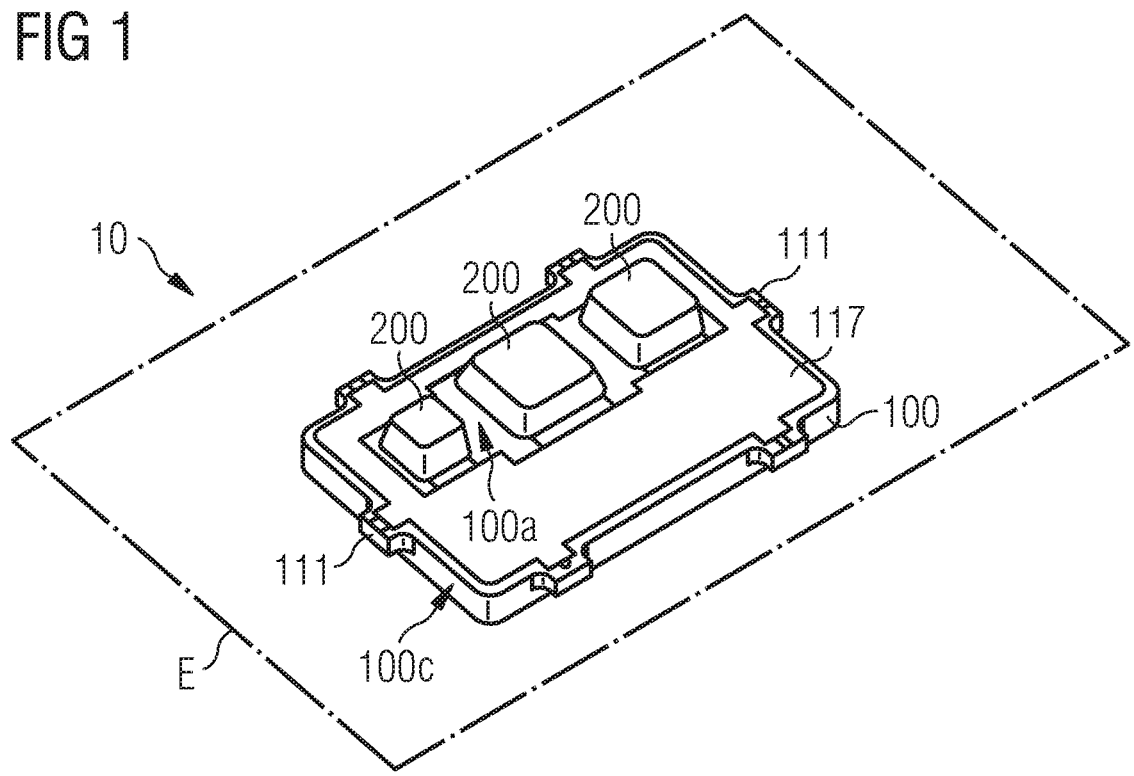
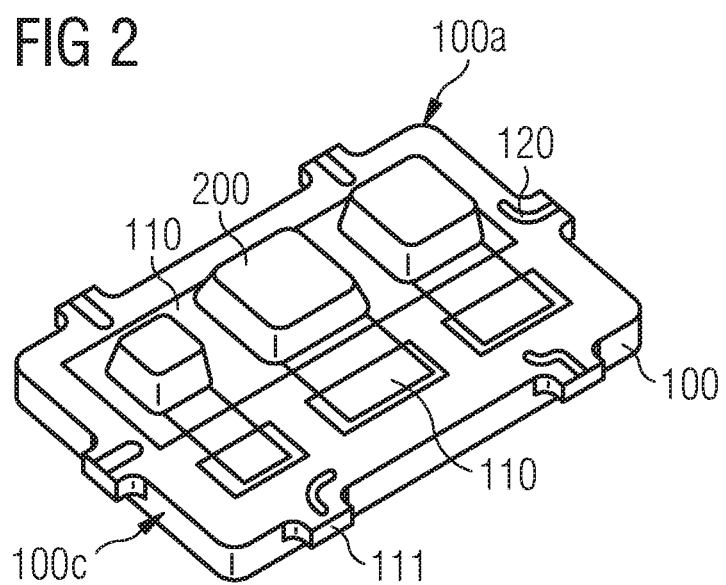

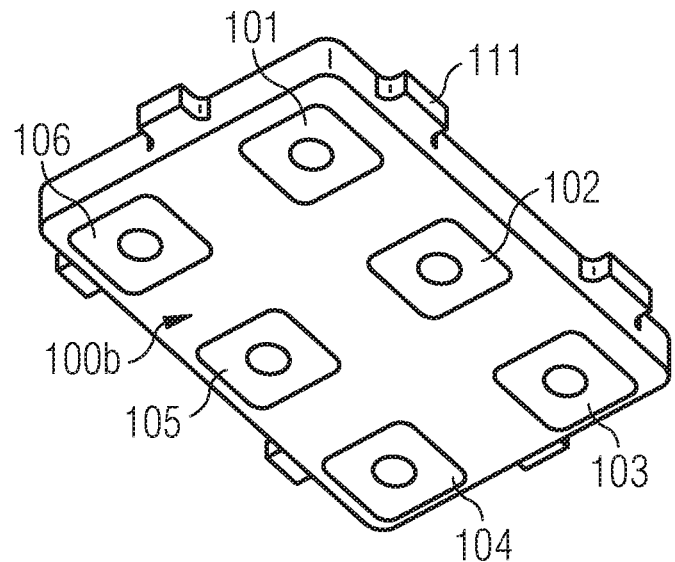
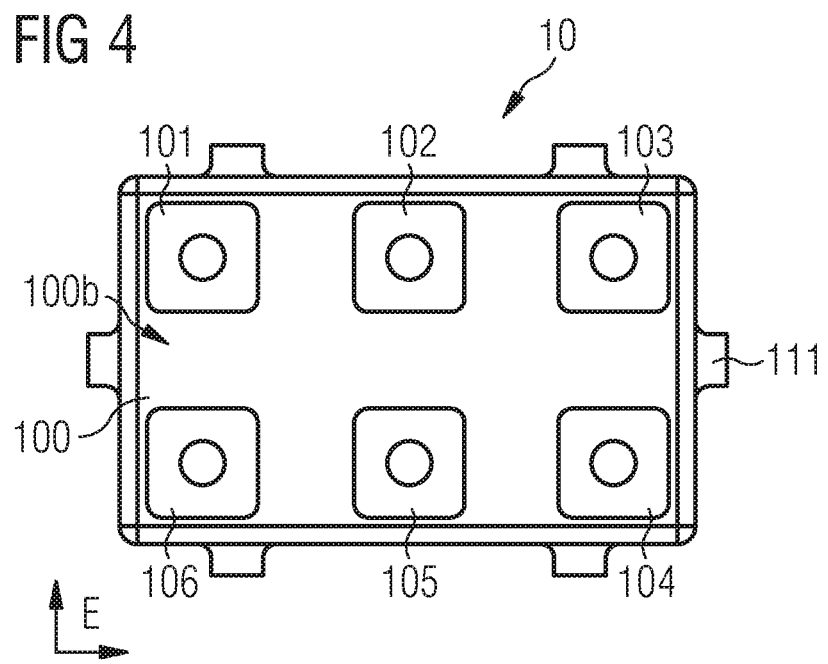

ND METHOD FOR
LIGHT-EMITTING COMPONENT, DISPLAY DEVICE AND METHOD FOR MANUFACTURING A DISPLAY DEVICE

CROSS-REFERENCE TO RELATED APPLICATION

The present application is a national stage entry according to 35 U.S.C. § 371 of PCT application No.: PCT/EP2018/076013 filed on Sep. 25, 2018; which claims priority to German Patent Application Serial No.: 10 2017 123 290.7, which was filed on Oct. 6, 2017; which are incorporated herein by reference in their entirety and for all purposes.

TECHNICAL FIELD

A light-emitting component and a display device are specified. A method for manufacturing a display device is also specified.

BACKGROUND

An object to be achieved consists inter alia of indicating a light-emitting component, in particular for use in a display device or in a display, which is particularly compact, and which can be manufactured particularly economically. A further object to be achieved consists in indicating a display device that can be manufactured particularly economically and in a time-saving manner. A further object to be achieved consists in indicating a method for manufacturing such a display device.

The light-emitting component is, for example, an optoelectronic component that is configured when operated as intended to emit light, in particular light that is visible to humans. Light that is visible to humans is electromagnetic radiation from a wavelength the range between the wavelengths of infra-red radiation and the wavelengths of UV radiation.

SUMMARY

The light-emitting component comprises at least one IC chip, in particular a single IC chip, and at least one LED chip, in particular a plurality of LED chips, in particular a plurality of different LED chips.

The IC chip is, in particular, an integrated circuit, also known as an integrated switch, which is constructed with a semiconductor material. The IC chip can be constructed with monocrystalline semiconductor material, in particular monocrystalline silicon. The IC chip in particular comprises a plurality of mutually interconnected electronic elements such as, for example, transistors, diodes and/or further active or passive elements. In a non-limiting embodiment, such an IC chip comprises a circuit with a plurality of active and/or passive elements. The IC chip comprises, for example, at least two transistors and a capacitor.

The at least one LED chip consists in particular of a light-emitting semiconductor chip that comprises at least one active region in which, when the LED chip is operated as intended, electromagnetic radiation is generated.

The LED chip is, for example, constructed with an inorganic semiconductor material, in particular with III-V compound semiconductor material and/or with II-VI compound semiconductor material.

The LED chip can alternatively be constructed with organic material.

In the case of a light-emitting component with a plurality of LED chips, at least one LED chip constructed with an inorganic material and at least one LED chip constructed with an organic material can be provided on the IC chip.

In a further form of embodiment, the light-emitting component comprises at least one laser chip alternatively or in addition to the LED chip.

According to one form of embodiment, the IC chip and the LED chip are not each encapsulated separately with, for example, a housing material comprising a plastic material. In particular, the LED chip and the IC chip do not comprise separate housings. The LED chip and the IC chip can each have a passivation which is not a self-supporting structure. The LED chip and the IC chip can be given a common encapsulation, and thereby in particular be protected from environmental influences.

According to one form of embodiment, the LED chip is arranged on a top surface of the IC chip and is electrically coupled with said chip. The top surface of the IC chip is, for example, a primary surface of the IC chip. The LED chip is, for example, mounted with a contact surface on a mounting area at the top surface of the IC chip. The LED chip is in particular connected to the IC chip through material bonding. The term "material bonding" includes not only direct physical contact but also includes cases where metal solder material, electrically conductive adhesive and/or another electrically conductive material is located between the contact surfaces.

According to one form of embodiment, the LED chip can be driven by means of the IC chip. For example, an electrical signal applied to the LED chip can be specified by means of the IC chip, so that the LED chip emits light in a predefined manner. The electrical signal is, for example, a pulse-width modulated signal or an analog current or voltage signal. The LED chip is, for example, electrically connected to the connection regions of the IC chip. The connection regions can, for example, be arranged at the top surface of the IC chip. The LED chip can, in particular, be surface-mountable, so that the LED chip can be electrically contacted at a side facing toward the IC chip and can be connected to the connection regions of the IC chip.

The light-emitting component can, further, comprise a plurality of LED chips that are arranged on the top surface of the IC chip. The LED chips can, for example, be operated separately by means of the IC chip.

According to one form of embodiment, the IC chip comprises at least two electrical connection surfaces at a base surface facing away from the LED chip. Active and/or passive semiconductor components that are embedded in the IC chip can, for example, be operated through the connection surfaces. The IC chip can be operable through the connection surfaces that are arranged on the base surface, so that it is surface-mountable.

According to at least one form of embodiment, the light-emitting component can be electrically contacted and operated through the connection surfaces of the IC chip. The IC chip is, for example, configured such that when operated as intended it can be electrically operated through the connection surfaces, wherein the IC chip operates the LED chip in a specified manner.

In summary, one form of embodiment of the light-emitting component comprises an IC chip and an LED chip. The LED chip is arranged on a top surface of the IC chip and electrically coupled to it, while the LED chip can be electrically driven by means of the IC chip. The IC chip comprises at least two electrical connection surfaces on a base surface facing away from the LED chip, and the light-emitting component can be electrically contacted and operated through the connection surfaces.

A light-emitting component described here is based inter alia on the following considerations:

In conventional LED display devices with a passive matrix circuit, the individual LED chips are only operated during short time intervals. For this reason, LED chips with large chip surfaces are required, in order to achieve a sufficient light density. With increasing size and resolution of an LED display device, the use of an active matrix circuit is required, since by means of the active matrix circuit, the LED chips can be operated continuously. In an active matrix circuit, all the LED chips are arranged on a common circuit structure, wherein the drive electronics of the display system are arranged in a common group. Such a display device can thus only be operated and tested as a whole. Testing and selecting individual parts of the display device are not possible here.

In the light-emitting component described here, the IC chip comprises the drive electronics by means of which the LED chip can be driven. The light-emitting components can each be tested and selected independently of one another before they are assigned to a display device.

Advantageously, the selection of light-emitting components permits the manufacture of particularly reliable display devices. In particular, the selectability of the light-emitting components enables a particularly high yield of display devices that function as intended.

According to at least one form of embodiment, multiple LED chips are arranged on the top surface in such a way that the light-emitting component is able to emit multicolored light. The LED chips can here be operated by means of the IC chip in such a way that a color-location of light emitted from the light-emitting component can be adjusted. At least three LED chips are, for example, arranged on the top surface of the light-emitting component. In particular the LED chips that are arranged on the top surface of an IC chip are configured to emit light that has a different color-location. The light-emitting component, for example, comprises an LED chip that is configured to emit red light, an LED chip that is configured to emit green light and an LED chip that is configured to emit blue light.

The LED chips that are arranged together on the IC chip can form in particular one pixel of a display device. The light-emitting component comprises, for example, three LED chips per pixel, by means of which multicolored light can be emitted. The color-location of the multicolored light can be specified with the IC chip. The LED chips that are arranged on a common IC chip can, further, form multiple pixels of a display device. In particular, three LED chips always form one pixel of a display device, so that the number of LED chips arranged on a common IC chip is a multiple of three.

According to at least one form of embodiment, the LED chip has a maximum edge length of 40 μm along the top surface. The LED chip can, in particular, have a maximum edge length of 20 μm. The LED chip can, for example, have a polygonal, in particular rectangular, contour with the maximum edge length along the top surface. Alternatively, the LED chip can have a round contour along the top surface, wherein, in this case, a maximum lateral dimension, for example a diameter of the LED chip, which is a maximum of 40 μm, such as a maximum of 20 μm, is to be considered as the edge length. Advantageously, the LED chips have a particularly low edge length, which results in a particularly small chip surface.

According to at least one form of embodiment, the IC chip has a maximum thickness of 50 μm perpendicular to its primary plane of extension. According to at least one form of embodiment, the IC chip has in particular a maximum thickness of 20 μm perpendicular to its primary plane of extension.

According to at least one form of embodiment, the IC chip has at least two projections at its side surfaces that extend along the primary plane of extension. The projections can be formed with the material of the IC chip. The projections can, in particular, be formed with multiple layers that run along the primary plane of extension of the IC chip. The IC chip has, for example, a rectangular contour when viewed from above, wherein the projections are formed at least at two opposing edges of the rectangular contour.

According to at least one form of embodiment, electrical structures for testing the light-emitting component are provided on the projections. For example, an electrically conductive structure is arranged in the region of each of the projections, via which the light-emitting component can be electrically contacted and operated. The side surfaces of the IC chip in the region of the projections can be partially formed of the electrically conductive structure. Each electrically conductive structure on a projection is, for example, connected to precisely one of the connection surfaces of the IC chip. The number of the bridges or projections of an IC chip corresponds, for example, to the number of connection surfaces of the IC chip. The electrically conductive structure is, in particular, electrically conductively connected to the LED chip and/or the IC chip. The electrically conductive structures are, for example, electrically conductively connected to the connection surfaces. In a non-limiting embodiment, the IC chip and/or the LED chip can be electrically operated through the electrically conductive structure.

A display device comprises a large number of the light-emitting components described here.

In one form of embodiment of the display device, the light-emitting component is a component of an active matrix display. In particular, here, each individual image point of the display comprises a circuit with active electronic elements, wherein, for example, one image point is formed with one light-emitting component.

According to at least one form of embodiment of such a display device, the light-emitting components are arranged on a common carrier at the node points of a periodic grid. The light-emitting components here are connected for electrical operation through the connection surfaces. The light-emitting components are, for example, arranged on the carrier at the node points of a regular rectangular grid. The carrier in particular comprises a large number of conductive tracks by means of which the light-emitting components are electrically connected. In particular, the light-emitting components can be connected together electrically with one another. The carrier is, for example, constructed with a monocrystalline material, in particular silicon. The conductive tracks can be arranged one above the another on the carrier in a first plane and in a second plane, wherein the conductive tracks are electrically insulated from one another in regions where they overlap one another, for example by means of a dielectric.

Each light-emitting component can, in particular comprise a large number of pixels. Neighboring pixels, for example, that are formed on a common light-emitting component are arranged with a spacing from one another in a lateral direction that is the same as pixels adjacent to one another that are formed on different light-emitting components. Pixels that are adjacent to one another are here arranged side by side along the primary plane of extension of the display device, while no further pixels are arranged between two neighboring pixels along the primary plane of extension of the display device.

According to at least one form of embodiment, the LED chips of the light-emitting components of the display device can be operated independently of one another. In particular, any desired LED chips of the display device can be operated simultaneously by means of the IC chips. The light-emitting components form, for example, an active matrix circuit that is constructed in a modular manner with the large number of IC chips.

A method for manufacturing a display device is furthermore specified. A display device is a device for optically signaling changeable information. Moving images can, for example, be displayed by means of the display device. The display device can in particular be a screen. The display device can, alternatively, be a video wall.

A display device as described here can in particular be manufactured with a method. This means that all of the features disclosed for the display device are also disclosed for the method, and vice versa.

According to one form of embodiment, in a step A) a plurality of LED chips are manufactured simultaneously in one and the same first method. The plurality of LED chips are, for example, manufactured simultaneously in a common first group, for example being grown on a common substrate by means of an epitaxial method. In particular these are LED chips which all nominally emit light of a single color-location in a specific operating mode. After their manufacture in the group, which usually includes a passivation of the semiconductor surfaces, the LED chips are, in particular, no longer encapsulated with a housing material. The LED chips do not have any encapsulation that, for example, protects the LED chips from environmental influences.

A passivation, that can be formed, for example, with a silicon oxide (SiOx, such as $SiO_2$), a silicon nitride ($SiN_x$) or an aluminum oxide ($Al_2O_3$), can be arranged on the outer surfaces of the LED chips. A design with a partial passivation or without passivation, in which the at least one outer surface of the LED chip is formed with an epitaxial or grown material, is, however, also possible.

In a step B) a plurality of IC chips are manufactured simultaneously in one and the same second method. The IC chips are, for example, manufactured in a common second group. The IC chips are, in particular, formed in layers, wherein the layers are applied additively, layer-by-layer, to a common substrate.

The IC chips comprise, for example, thin-film circuits that are manufactured by means of additive processes and photo lithographic processes. In particular, the IC chips are not arranged as finished components on the substrate, but are manufactured on the substrate in steps. For example, the IC chips can be formed with multiple thin-film transistors. In particular, the IC chips are not encapsulated, so that, for example, the side surfaces are formed at least partially with the materials that are applied in layers. The IC chips in the second group can, for example, be electrically contacted and operated. After their manufacture in the group, which usually includes a passivation of the semiconductor surfaces, the IC chips are, in particular, no longer encapsulated with a housing material.

In a step C), a plurality of light-emitting components are formed, wherein LED chips from the first group are applied to top surface IC chips of the second group. In particular, multiple LED chips here are transferred simultaneously from the first group and rigidly mechanically connected to the IC chips. The LED chips are, for example, bonded to the IC chip by means of a gluing method or a soldering method.

In a step D), the light-emitting components are selected. Light-emitting components are, here, selected with reference, for example, to a predefined criterion. The light-emitting components are, for example, selected with reference to externally visible features. The light-emitting components can here, for example, be selected with reference to a surface property of the IC chip or of the LED chip. Alternatively, different properties of the IC chips and/or of the LED chips can be ascertained during one of the steps A) to C), with reference to which the light-emitting components are selected in step D). Light-emitting components are transferred to a carrier of the display device in a step E). A plurality of light-emitting components are, for example, transferred here simultaneously. The light-emitting components are, in particular, rigidly mechanically bonded to the carrier. The light-emitting components are, for example, electrically and/or mechanically bonded to the carrier by means of a suitable electrically conductive glue, by means of a non-conductive glue, by means of a solder or by means of thermo-compression. Furthermore, the light-emitting components are connected to the carrier for electrical operation.

The carrier is, for example, designed as already described above.

According to one form of embodiment, in a step C1), which is carried out between steps C) and D), the light-emitting components are electrically and/or optically tested. For example, multiple light-emitting components are simultaneously electrically conductively contacted and operated in the group in which the IC chips are manufactured. In particular, multiple light-emitting components are contacted simultaneously when testing and operated in sequence for test purposes in sequential periods of time by means of a cross-matrix circuit. Advantageously, the light-emitting components can be selected after testing with reference to the test results in a step D), so that only those light-emitting components that satisfy a predefinable test criterion are transferred to the carrier of the display device. This enables a particularly high proportion of functioning image points in the display device.

According to one form of embodiment, multiple light-emitting elements are transferred simultaneously in step C) by means of a stamping process. In the stamping process the LED chips are, for example, fastened by means of adhesion to a first transfer carrier. The first transfer carrier can, in particular, be formed with a visco-elastic elastomer material to which the LED chips adhere during the transfer due to van der Waals forces. The bonding force between the first transfer carrier and the LED chips depends, for example, on the speed with which the first transfer carrier is lifted up perpendicularly to the surface from which the LED chips are removed or at which the LED chips are arranged. Alternatively, the LED chips can be held at the first transfer carrier during the stamping process by means of suction. In particular, the first transfer carrier can comprise a large number of channels by means of which the LED chips are sucked up.

The first transfer carrier is, for example, brought into contact with the LED chips at a surface of the LED chips facing away from the substrate. The first transfer carrier is then moved away from the primary plane of extension of the substrate with a first speed perpendicularly to said plane. For placement of the LED chip, it can be arranged at the top surface of an IC chip with a surface facing away from the first transfer carrier. The first transfer carrier is then lifted up with a second speed perpendicularly to the top surface of the IC chip. The second speed is, for example, lower than the first speed.

The first transfer carrier is, for example, a carrier that is coated with an adhesive layer which can, for example, be selectively applied or activated. In this way it is possible that only selected light-emitting components are simultaneously transferred. LED chips can, alternatively, be fastened at the first carrier selectively by means of suction.

According to one form of embodiment, multiple light-emitting components are transferred simultaneously in step F) by means of a stamping process. The light-emitting components are, for example, transferred in the stamping process analogously to the transfer method from step C). In step F) the IC chips take the place of the LED chips in step C).

The second transfer carrier is, for example, brought into contact with a surface facing away from the base surface of the IC chip. The second transfer carrier can then be moved away from the primary plane of extension of the IC chip with a third speed perpendicularly to said plane. For placement of the light-emitting component, it can be arranged with a surface facing away from the second transfer carrier at a primary surface of the carrier of the display device. The second transfer carrier can then be moved away with a fourth speed perpendicularly to the top surface of the IC chip. The fourth speed is, for example, lower than the third speed.

According to one form of embodiment, step E) is carried out before step D). In step E) the light-emitting components are, for example, transferred in parallel to the carrier of the display device without previous selection in one and the same step. The light-emitting components can, for example, be tested as a group in a step C1). The light-emitting components can then be transferred to the carrier of the display device in step E). Individual light-emitting components can then be removed from the carrier in step D). The light-emitting components are, for example, selected here depending on the test results of step C1). In particular, individual light-emitting components that do not demonstrate a predefined property during testing are selectively removed from the carrier of the display device, in particular in sequence, and replaced by light-emitting components that do demonstrate the predefined property.

According to one form of embodiment, the light-emitting components are selectively transferred to a carrier, so that the steps D) and E) are carried out simultaneously. The second transfer carrier is, for example, selectively coated with an adhesive material for this purpose, or an adhesive material applied to the second transfer carrier is selectively activated, so that only selected light-emitting components are transferred in step E) to the carrier of the display device. The second transfer carrier can, alternatively, be configured such that the light-emitting components are selectively sucked up, so the light-emitting components can be selected and transmitted separately from one another by means of the second transfer carrier.

According to one form of embodiment, in step B) the IC chips are manufactured on a sacrificial layer that is removed before the step E). The IC chips are, for example, manufactured in a group on a common sacrificial layer. The IC chips in this group are, in particular, arranged on a common substrate by means of the sacrificial layer. The sacrificial layer is, furthermore, arranged for example on a base surface of the IC chips.

The sacrificial layer can be removed by means of an etching method, so that the IC chips are only rigidly mechanically connected to the anchoring structure by bridges. After removal of the sacrificial layer, the IC chips are furthermore not in direct, mechanical contact with the substrate on which the IC chips are manufactured. A gap is formed between the IC chips and the substrate through the removal of the sacrificial layer.

According to one form of embodiment, the IC chips are manufactured as a group in step B), wherein the IC chips are rigidly mechanically bonded by means of the bridges to a common anchoring structure, wherein the bridges extend along the primary plane of extension of the IC chips, and the anchoring structure completely surrounds each of the IC chips completely in a lateral plane. The anchoring structure is, for example, manufactured simultaneously in the same manufacturing process as the IC chips.

In particular, the anchoring structure is formed with the same material as the IC chips. The anchoring structure is, for example, constructed of multiple layers. The anchoring structure is in particular designed as a grid that is arranged in one plane with the IC chips.

When the light-emitting components are transferred by means of the stamping process, the mechanical bond of the IC chips to the anchoring structure is released. As the light-emitting components are released from the anchoring structure, the bridges are at least partially destroyed, for example through simple fracturing, wherein projections are formed. The projections are, in particular, each formed at least with a part of one of the bridges. In particular, the light-emitting components can be pushed by means of the second transfer carrier in the direction of the substrate, so that the bridges are destroyed and the mechanical connection between the light-emitting components and the anchoring structure is released.

The maximum height of the bridges or projections can be lower than the thickness of the IC chip. The bridges have a maximum height of, for example, 3 μm, such as 1 μm, perpendicularly to the top surface of the IC chip. The projections have a maximum height of, for example, 3 μm, such as 1 μm, perpendicularly to the top surface of the IC chip.

According to one form of embodiment, the anchoring structure is provided with contact surfaces, wherein the contact surfaces are each electrically conductively connected with a plurality of LED chips that are arranged on different IC chips. Furthermore, in step C1) the light-emitting components are electrically operated through the contact surfaces. The contact surfaces are, for example, arranged in an edge region of the anchoring structure, and are freely accessible from outside. In particular, a plurality of light-emitting components are simultaneously electrically operated in step C1). The contact surfaces are, for example, electrically conductively bonded to electrically conductive structures that are arranged on the top surface of the IC chips. When the light-emitting components are transferred to the carrier of the display device, the electrically conductive structures by means of which the light-emitting components are electrically conductively bonded to the contact surfaces are at least partially destroyed. Advantageously, the contact surfaces on the anchoring structure enable testing of the IC chips and/or of the LED chips before they are mounted on the carrier of the display device. In this way it is possible for exclusively fully functionally capable light-emitting components to be selected, so that the yield of fully functionally capable display devices is increased.

BRIEF DESCRIPTION OF THE DRAWINGS

Further advantages, advantageous embodiments and developments of the light-emitting component, the display device and of the method for manufacturing a display device emerge from the following non-limiting embodiments in connection with the illustrated figures.

Here, shown in schematic form in each case:

FIGS. 1, 2, 3, 4 and 5 show different views of a light-emitting component described here.

Figure 5:
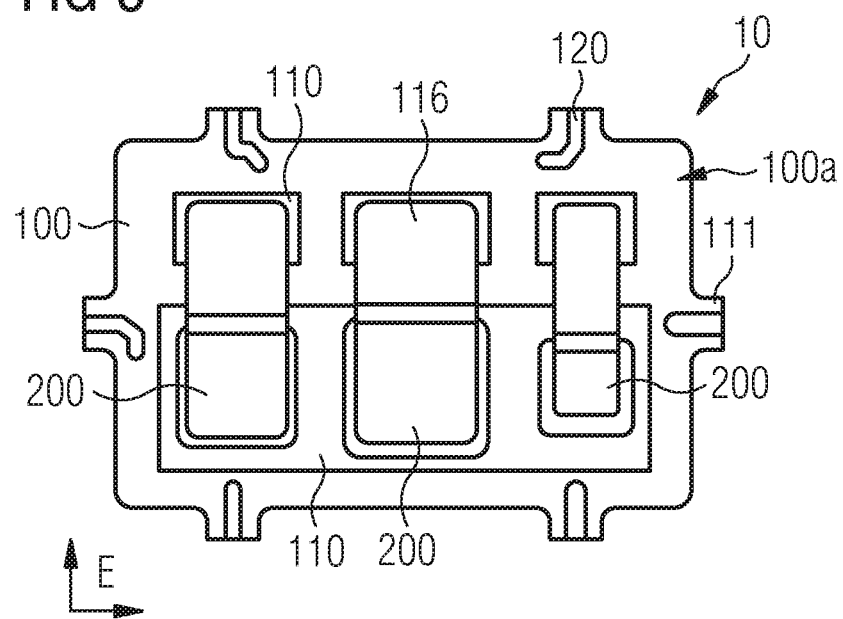

Elements that are the same, similar, or that have the same function are here given the same reference signs in the figures. The figures and the sizes of the elements illustrated in the figures relative to one another are not to be deemed as being to scale. Rather can individual elements be displayed with an exaggerated size for the sake of better illustration and/or for better understanding.

DETAILED DESCRIPTION

FIG. 1 shows a schematic, perspective view of an exemplary embodiment of a light-emitting component 10. The light-emitting component 10 comprises an IC chip 100, and three LED chips 200 that are arranged on the top surface 100a of the IC chip 100. The LED chips 200 can be driven by means of the IC chip 100. By means of the LED chips the light emitting component is able to emit multicolored light and to operate the LED chip 200 by means of the IC chip in such a way that a color-location of a light emitted by the light-emitting component is adjustable.

An anti-reflection layer 117 is arranged on the top surface 100a of the IC chip 100. The anti-reflection layer can, in particular, be formed with a black material, and can show a roughened surface to the outside. The anti-reflection layer 117 is configured to absorb or to scatter electromagnetic radiation arriving at the top surface 100a. Advantageously, a particularly high contrast of the light-emitting component can be achieved by means of the anti-reflection layer 117.

The IC chip 100 has an essentially rectangular contour along its primary plane of extension E. Projections 111 are formed at the end surfaces 100c of the IC chip 100 along the primary plane of extension E.

FIG. 2 shows a schematic, perspective view of an exemplary embodiment of a light-emitting component 10. In contrast to the exemplary embodiment illustrated in FIG. 1, no anti-reflection layer 117 is arranged on the top surface 100a. The LED chips 200 are arranged on a common connecting region 110, and are electrically conductively connected to said region. The LED chips, furthermore, are each electrically conductively connected, separately from one another, to a further connection region 110, via which the LED chips are electrically conductively contacted, separately from one another, and can be driven separately. An electrically conductive structure 120 is further arranged on the top surface 100a in the region of the projections 111. The IC chip 100 and/or the LED chips 200 can be electrically conductively contacted and driven through the electrically conductive structure 120.

The LED chips are each electrically conductively connected with the further connection regions 110 by means of a connecting layer 116. The connecting layer 116 is, for example, formed with a transparent, electrically conductive material.

FIG. 3 shows a schematic, perspective view of an exemplary embodiment of a light-emitting component 10. A first 101, a second 102, a third 103, a fourth 104, a fifth 105, and a sixth 106 electrical connection surface are arranged at a base surface 100b of the IC chip 100. The LED chips 200 arranged on the top surface 100a can be electrically conductively contacted and operated through the connection surfaces 101, 102, 103, 104, 105, 106 at the base surface 100b of the IC chip 100. In particular, the IC chip 100 can be electrically conductively contacted and operated through the connection surfaces 101, 102, 103, 104, 105, 106. The connection surfaces 101, 102, 103, 103, 104, 105, 106 are electrically conductively connected to a circuit, comprising logic, of the IC chip 100. Through-contacts are, for example, provided in the IC chip 100 for this purpose through a silicon layer of the IC chip 100, wherein the through-contacts penetrate the IC chip 100 transversely to its primary plane of extension.

FIG. 4 shows a schematic plan view of the base surface 100b of an exemplary embodiment of a light-emitting component 10. The first 101, the second 102, the third 103, the fourth 104, the fifth 105, and the sixth 106 electrical connection surface are arranged at the base surface 100b. The electrical connection surfaces 101, 102, 103, 104, 105, 106 are, for example, each electrically conductively connected on the base surface 100b of the IC chip 100 to electrically conductive structures 120 that are arranged at the top surface 100a of the IC chip 100. Each electrical connection surface 101, 102, 103, 104, 105, 106 can thus also be electrically conductively contacted through an electrically conductive structure 120 on the top surface 100a of the IC chip 100. The light-emitting component 10 comprises, for example, exactly the same number of electrically conductive structures 120 on the top surface 100a as the connection surfaces that are arranged at the base surface 100b of the IC chip 100. Each electrically conductive structure can, in particular, be arranged at the top surface 100a in the region of a projection 111 of the IC chip 100. Different electrically conductive structures 120 are, for example, electrically insulated from one another. Different connection surfaces 101, 102, 103, 104, 105, 106 can, further, also be electrically insulated from one another. The IC chip 100 in particular comprises exactly the same number of projections 111 as the electrical connection surfaces 101, 102, 103, 104, 105, 106 that are arranged at its base surface 100b. The electrical connection surfaces 101, 102, 103, 104, 105, 106 for example each have a size of at most 10×10 µm along the primary plane of extension E of the light-emitting component 10. The distance between two connection surfaces adjacent to one another is, for example, at least 10 µm.

FIG. 5 shows a schematic plan view of the top surface 100a of an exemplary embodiment of a light-emitting component 10. The light-emitting component 10 has, for example, an essentially rectangular contour with an edge length of 54 µm by 34 µm. Connection regions 110 are arranged on the top surface 100a of the IC chip 100, through which the LED chips 200 are contacted and operated. One connection region 110 is uniquely assigned to each LED chip 200, and is connected through a connecting layer 116 electrically conductively to a side of the LED chip 200 facing away from the IC chip. In particular, the connecting layer 116 is formed with a transparent, electrically conductive material. Electrically conductive structures 120 are further arranged on the top surface 100a of the IC chip 100, and are electrically conductively connected to the connection surfaces that are arranged on the base surface 100b. The thickness of the IC chip 100 perpendicular to its primary plane of extension from the base surface 100b to the top surface 100a is, for example, at most 50 µm, in particular at most 20 µm.

Figure 6:
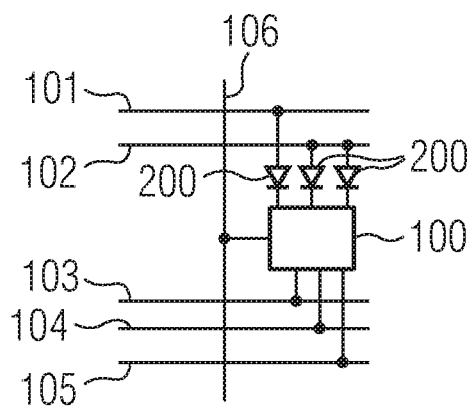
FIG. 6 shows a circuit diagram of a light-emitting component described here.

FIG. 6 shows a schematic illustration of an electrical circuit of an exemplary embodiment of a light-emitting component 10. The LED chips 200 are, for example, each connected at their cathode electrically conductively to the IC chip 100. The anodes of the LED chips 200 are electrically conductively connected to the first electrical connection surface 101 or the second electrical connection surface 102. The LED chip 200, which is configured to emit electromagnetic radiation in a red wavelength range, is, for example, electrically conductively connected to the first electrical connection surface 101, and the LED chips 200, which are configured to emit electromagnetic radiation in a blue wavelength range and in a green wavelength range, are electrically conductively connected jointly to the electrical connection surface 102.

The fifth electrical connection surface 105 is, for example, connected to a grounding electrode. The first connection surface 101 can, for example, have a potential of 2.5 V with respect to the fifth connection surface 105. The second connection surface 102 can, for example, have a potential of 3.5 V with respect to the fifth connection surface 105. A data signal can, for example, be applied at the third connection surface 103, by means of which the IC chip 100 is driven. The fourth electrical connection surface 104 can, further, have a potential of, for example, 1.8 V with respect to the fifth connection surface 105. A supply voltage for the IC chip 100 can, in particular, be present at the fourth connection surface 104. A further data signal can, for example, be present at the sixth electrical connection surface 106, by means of which the IC chip 100 is driven.

Figure 7:
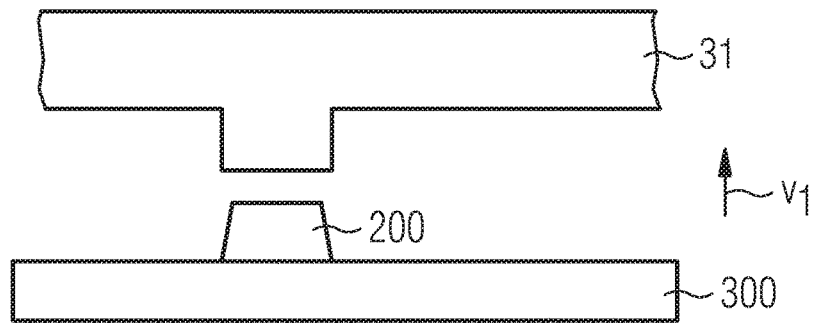
FIGS. 7 to 15 show a method for the manufacture of a display device described here.

FIG. 7 shows a schematic sectional view of an LED chip 200 of an exemplary embodiment of a light-emitting component 10 described here. The LED chip 200 is arranged on the substrate 300. The LED chip 200 is, for example, manufactured on the substrate 300 in a step A). A large number of LED chips 200 are, in particular, manufactured on the substrate 300. The large number of LED chips 200 are, in particular, manufactured simultaneously in one and the same process.

A part of a first transfer carrier 31 is furthermore illustrated schematically in FIG. 7. The first transfer carrier 31 is, for example, a stamp which is formed of an elastomer material. By means of the first transfer carrier 31, the LED chip 200 is removed from the substrate 300, so that the LED chip 200 is mechanically bonded to the transfer carrier 31 at a surface facing away from the substrate 300. The first transfer carrier 31 is brought for this purpose into direct contact with the LED chip 200, and then removed from the substrate 300 with a first speed V1 perpendicularly to the primary plane of extension of the substrate 300. The LED chip 200 is, in particular, bonded to the first transfer carrier 31 through adhesion.

Figure 8:
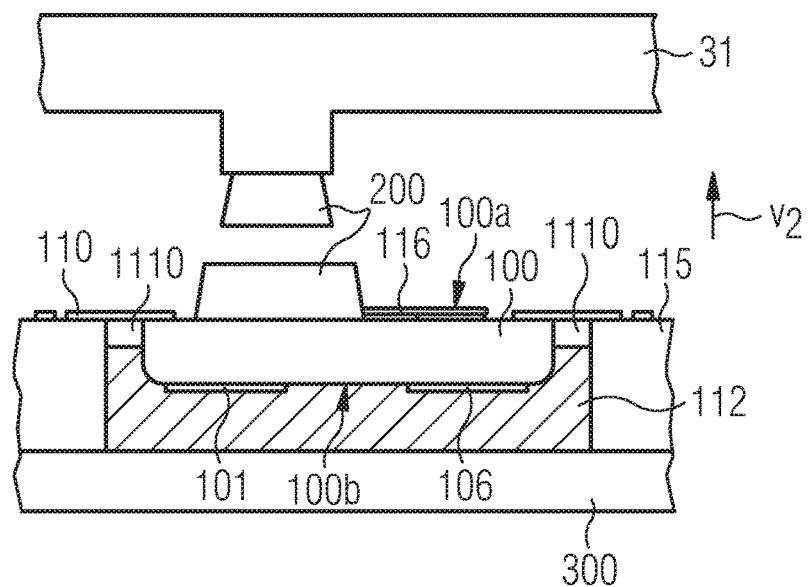

FIG. 8 shows a step for the manufacture of a display device 1 following that of FIG. 7. FIG. 8 shows a schematic sectional view of an IC chip 100 that is manufactured in a group in a step B). A plurality of IC chips 100 are, in particular, manufactured simultaneously in one and the same process. The IC chip 100 is, for example, manufactured on a sacrificial layer 112 which is in turn arranged on a substrate 300. The IC chip 100 is rigidly mechanically connected to an anchoring structure 115 by means of bridges 1110. The anchoring structure 115 is, for example, formed of the same material as the IC chip 100. The anchoring structure 115 is, furthermore, rigidly mechanically connected to the substrate 300.

An LED chip 200 that is configured to emit light in a green wavelength range when operated as intended has already been arranged in a step C) on the top surface 100a of the IC chip 100. Electrically conductive structures 120 are further arranged on the top surface 100a of the IC chip 100, and extend over the bridges 1110 on the anchoring structure 115. The conductive structures 120 are electrically conductively connected to the connection surfaces 101, 106 that are arranged on the base surface 100b of the IC chip 100.

The LED chip 200 described in FIG. 7 is arranged in step C) on the top surface 100a of the IC chip by means of the first transfer carrier 31. A surface of the LED chip 200 facing away from the first transfer carrier 200 is brought for this purpose into direct contact with the top surface 100a of the IC chip 100. The LED chip 200 is in particular arranged on a connection region 110 with the surface facing away from the first transfer carrier. The first transfer carrier is then removed from the IC chip 100 perpendicularly to the top surface 100a of the IC chip 100 at a second speed V2. The second speed V2 is lower here than the first speed V1.

Figure 9:
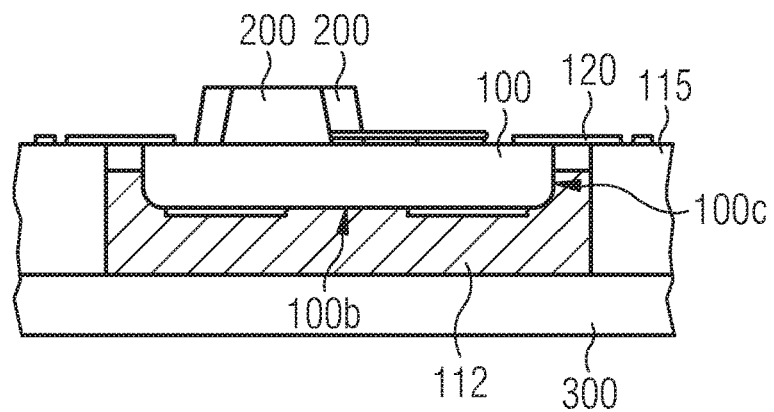

FIG. 9 shows a schematic, sectional view of an exemplary embodiment of a light-emitting component 10. FIG. 9 shows, for example, a light-emitting component 10 after the steps described in FIGS. 7 and 8 have been carried out. In further steps, the LED chips 200 are each electrically conductively connected by means of a connecting structure 116, so that the LED chips can be operated by means of the IC chip 100.

Figure 10:
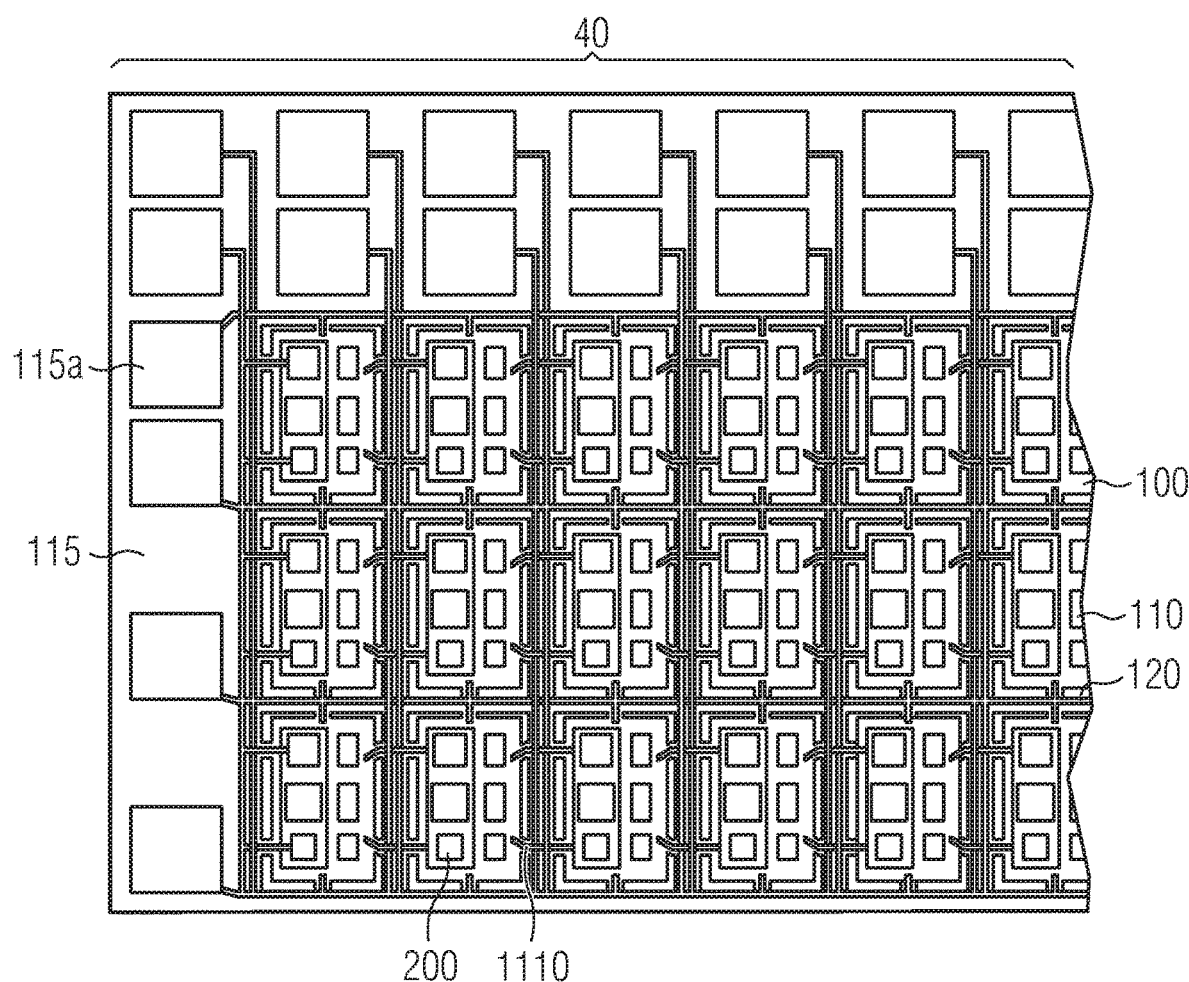

FIG. 10 shows a schematic plan view of a plurality of IC chips 100 according to an exemplary embodiment, which are arranged as a group in the manufacture of a display device 1. The IC chips 100 are rigidly mechanically bonded by means of bridges 1110 to the common anchoring structure 115, wherein the bridges 1110 extend along the primary plane of extension E of the IC chip 100, and the anchoring structure 115 fully surrounds each of the IC chips 100 in their primary plane of extension E. The sacrificial layer 112 that is arranged between the IC chips 100 and the substrate 300 is removed by means of an etching process. In particular, after the removal of the sacrificial layer 112 the IC chips 100 are only mechanically bonded to the anchoring structure 115 by the bridges 1110.

Electrically conductive structures 120 are arranged on the anchoring structure 115, by means of which the IC chips 100 are electrically conductively bonded to the contact surfaces 115a. The contact surfaces 115a are arranged in the edge region of the anchoring structure 115, and allow testing of the IC chips 100 and/or of the LED chips 200 before the IC chips 100 are released from the group in which the IC chips 100 are manufactured. A plurality of LED chips 200 that are arranged on different IC chips 100 can, for example, be electrically conductively contacted and operated through a contact surface 115a. To test the light-emitting components 10, a plurality of light-emitting components 10 are simultaneously electrically contacted through the contact surfaces 115a, and operated in sequence by switching through the cross-matrix. Electrical and/or optical properties of the light-emitting components can, for example, be ascertained here, with reference to which the light-emitting components are selected in a following step.

The electrically conductive structures 120 are arranged on the anchoring structure 115, for example at least partially in two overlapping planes, so that the electrically conductive structures 120 are arranged in a mutually crossing manner without being electrically connected to one another. In particular, the electrically conductive structures are manufactured in the same manufacturing process as the IC chips 100. The electrically conductive structures 120 are, for example, manufactured simultaneously with the connecting regions 110 of the IC chips 100. A plurality of test blocks 40 can, in particular, be arranged on a common substrate 300, and are tested simultaneously in a common step C1). A test block 40 here describes a plurality of light-emitting components 10 which can be electrically conductively contacted through a common contact surface 115c and which are manufactured in a common group.

When testing the light-emitting components 10, a measurement of electrical and/or optical properties of the light-emitting components 10 is in particular carried out in step C1). Here, for example, at least one of the ascertained properties is compared with a predefined specification. Depending on whether a light-emitting component 10 satisfies this predefined specification, a selection of the light-emitting components 10 can, for example, be carried out in a step D).

Figure 11:
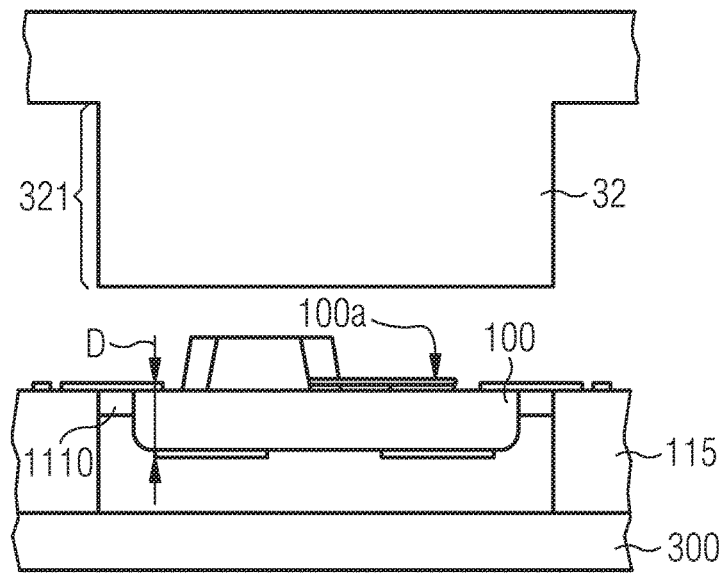
Figure 12:
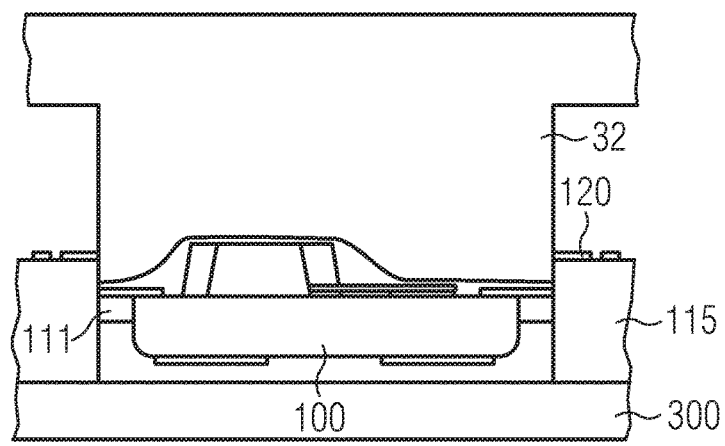
Figure 13:
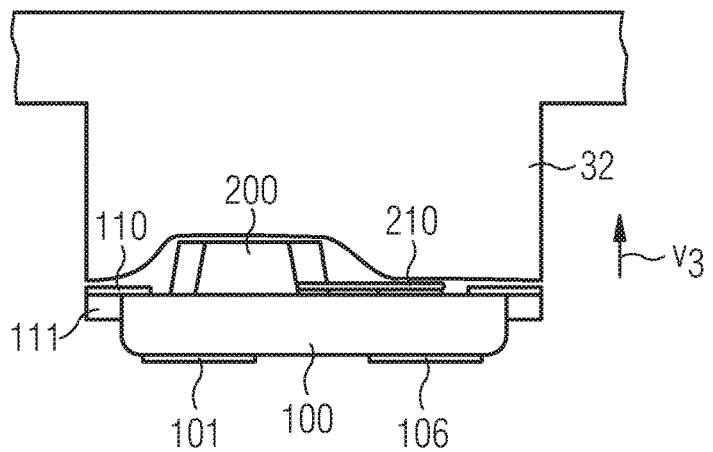

FIGS. 11 to 13 show a schematic sectional view of a light-emitting component 10 according to one exemplary embodiment that is transferred in the manufacture of a display device by means of a stamping process in step F). According to this exemplary embodiment, a second transfer carrier 32 is pressed onto the top surface 100a of the light-emitting component 10. In particular, the second transfer carrier 32 can have an elevated structure 321 that is configured to enter into a direct connection with the light-emitting component 10. The elevated structure 321 is imprinted onto the top surface 100a of the light-emitting component 10, whereby the light-emitting component 10 and the second transfer carrier 32 are bonded to one another by means of an adhesive force.

As is illustrated in FIG. 12, the mechanical connection between the light-emitting component 10 and the anchoring structure 115 is released when the second transfer carrier 32 is imprinted. In particular, the bridges 1110 are at least partially destroyed when the light-emitting component 10 is released from the anchoring structure 115. In particular, the projections 111 form when the light-emitting component 10 is released from the anchoring structure 115.

As illustrated in FIG. 13, the elevated structure 321 is formed at least partially with an elastically deformable material which adapts itself to the surface structure of the light-emitting component 10. The second transfer carrier 32 is thus, for example, in direct mechanical contact with different surfaces of the light-emitting component 10, while the different surfaces do not necessarily lie in the same plane. The second transfer carrier 32 can, in particular, have a structured surface that forms a negative profile of the surface of the light-emitting component 10 facing toward the second transfer carrier 32. For example, the second transfer carrier 32 comprises recesses in the region of the LED chips, so that the second transfer carrier 32 is in direct mechanical contact with both the LED chip as well as with the IC chip.

Figure 14:
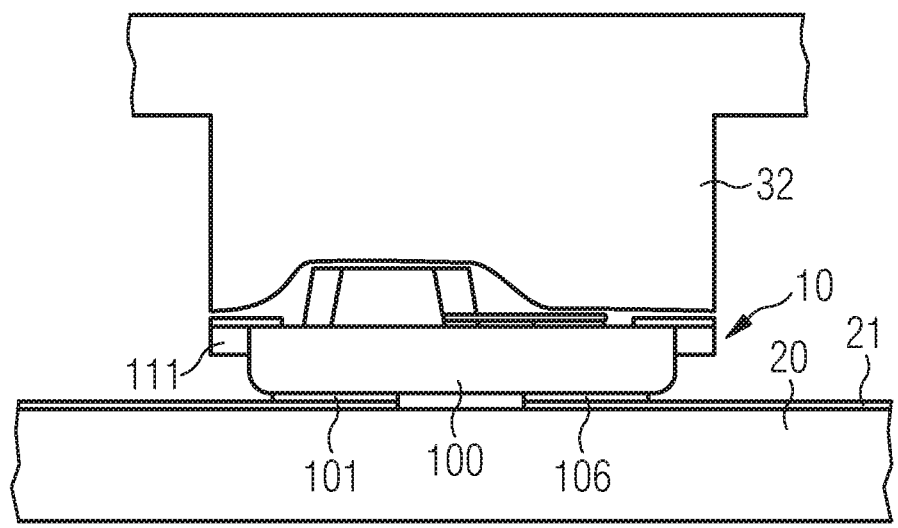

FIG. 14 shows a schematic sectional view of an exemplary embodiment of a light-emitting component 10 which is applied to a carrier 20 in a step E) in the manufacture of a display device 1. The light-emitting component 10 is arranged by means of the second transfer carrier 32 on conductive tracks 21 that are arranged on the side of the carrier 20 facing toward the light-emitting component 10. In particular, each connection surface 101, 102, 103, 104, 105, 106 of the light-emitting component 10 is electrically conductively contacted independently of the further connection surfaces 101, 102, 103, 104, 105, 106 of the light-emitting component by means of the conductive tracks 21. In particular a plurality of light-emitting components 10 are transferred to the carrier 20 by means of the second transfer carrier 32. The light-emitting components 10 are, for example, simultaneously transferred to the carrier 20 selectively in a common step. In particular, the light-emitting components can be selected depending on a property ascertained in step C1).

Figure 15:
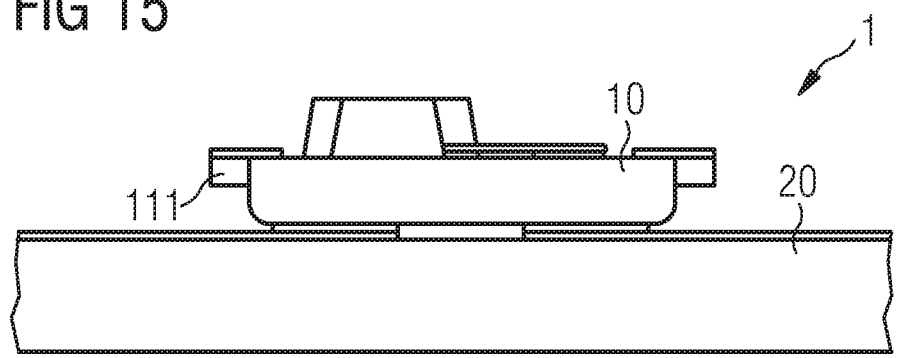

FIG. 15 shows a sectional view of an exemplary embodiment of a part of the display device 1. The display device 1 in particular comprises a plurality of light-emitting components 10 that are arranged on the carrier 20 and can be operated through the conductive tracks 21.

Figure 16:
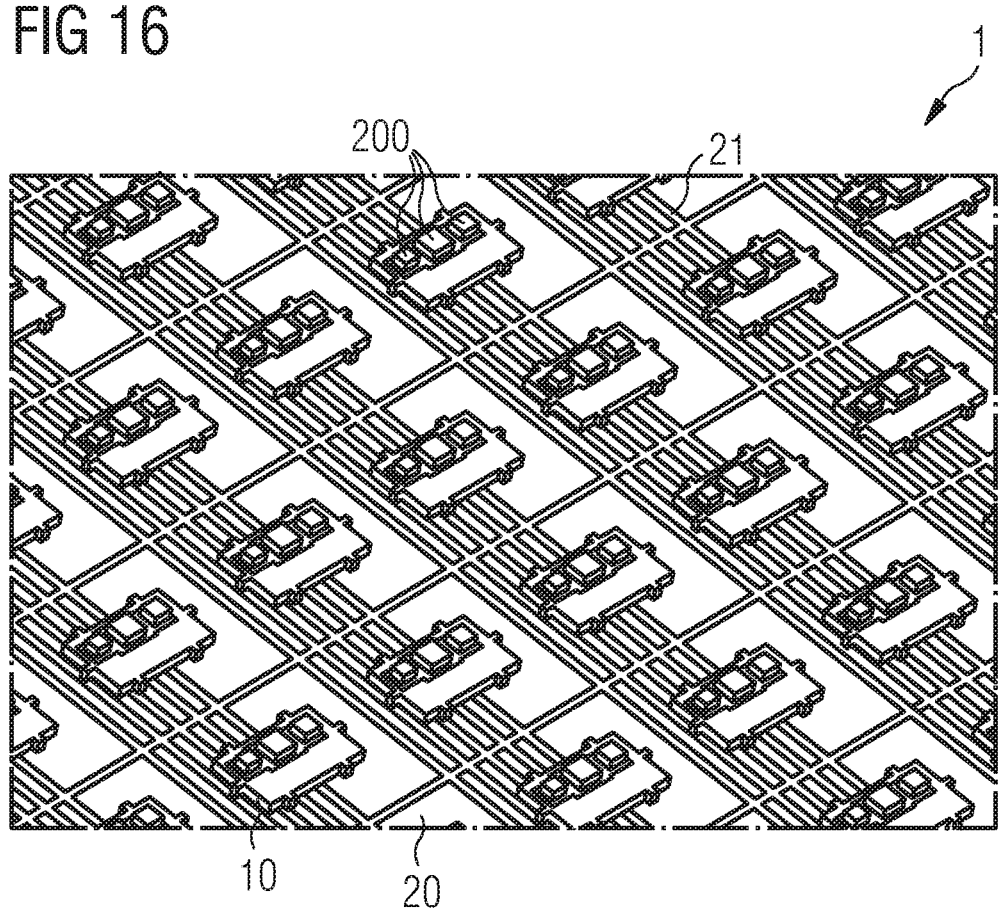
FIG. 16 shows a perspective plan view of a display device described here.

FIG. 16 shows a schematic, perspective view of an exemplary embodiment of a display device 1. The plurality of light-emitting components 10 is arranged on a common carrier 20, and electrically conductively contacted through conductive tracks 21. In particular, the LED chips 200 of the light-emitting components 10 can each be operated separately from one another. For example, the LED chips 200 that are arranged together on an IC chip 100 can form one pixel of a display device 1. The display device 1 comprises, for example, three LED chips 200 per pixel, by means of which multicolored light that has a definable color-location can be emitted.

The light-emitting components 10 are, for example, arranged on the surface of the carrier 20 at the node points of a regular rectangular grid. The light-emitting components are in particular arranged along lines and columns along the primary plane of extension of the display device 1. The light-emitting components that are arranged in a common column are, for example, at least partially electrically conductively contacted through a common conductive track 21. For example, each sixth connection surface 106 of light-emitting components 10 that are arranged in a common column is connected together by means of a common conductive track. Third connection surfaces 103 of light-emitting components 10 that are arranged in a common row can further be electrically conductively connected by a conductive track 21. In particular, signals can be transferred to the light-emitting components 10 in rows and columns through the conductive track 21.

Alternatively, LED chips 200 that are arranged on a common IC chip 100 can, further, form multiple pixels of a display device 1. In particular, three LED chips 200 always form one pixel of a display device 1, so that the number of LED chips 200 arranged on a common IC chip 10 is a multiple of three. Each light-emitting component can in particular comprise a large number of pixels. In particular, neighboring pixels that are formed on a common light-emitting component 10 are arranged with an equal spacing from one another along the primary plane of extension of the display device 1 as pixels adjacent to one another that are formed on different light-emitting components 10. Pixels that are adjacent to one another are here arranged side by side along the primary plane of extension of the display device 1, wherein no further pixels are arranged between two neighboring pixels along the primary plane of extension of the display device 1.

The invention is not restricted by the description based on the exemplary embodiments to these. The invention rather comprises any new feature or any combination of features, that in particular contains any combination of features in the patent claims, even when this feature or this combination is not itself explicitly stated in the patent claims or exemplary embodiments.

LIST OF REFERENCE SIGNS

1 Display device
10 Light-emitting component
100 IC chip
100a Top surface
100b Base surface
100c Side surface
101 First connection surface
102 Second connection surface
103 Third connection surface
104 Fourth connection surface
105 Fifth connection surface
106 Sixth connection surface
110 Connection region
111 Projection
1110 Bridge
112 Sacrificial layer
115 Anchoring structure
115a Contact surface
116 Connecting layer
117 Anti-reflection layer
120 Electrically conductive structure
200 LED chip
300 Substrate
31 First transfer carrier
32 Second transfer carrier
321 Elevated structure
40 Test block
E Primary plane of extension
D Thickness
V1 First speed
V2 Second speed
V3 Third speed
V4 Fourth speed

The invention claimed is:

1. A light-emitting component comprising:
an IC chip;
an LED chip;
electrical structures for testing the light-emitting component provided on at least two projections; and
wherein:
the LED chip is arranged on a top surface of the IC chip and is electrically coupled to the IC chip;
the IC chip comprises the at least two projections on its side surfaces;
the LED chip is configured to be electrically driven by the IC chip;
the IC chip comprises at least two electrical connection surfaces at a base surface facing away from the LED chip; and
the light-emitting component configured to be electrically contacted and operated through the connection surfaces.

2. The light-emitting component as claimed in claim 1, wherein:
the plurality of LED chips is arranged on the top surface in such a way that the light-emitting component is configured to emit multicolored light; and
the plurality of LED chips is configured to be operated by the IC chip in such a way that a color-location of light emitted from the light-emitting component is adjusted.

3. The light-emitting component as claimed in claim 1, wherein the plurality of LED chips has a maximum edge length of 40 μm along the top surface.

4. The light-emitting component as claimed in claim 1, wherein the IC chip has a maximum thickness of 50 μm perpendicularly to its primary plane of extension.

5. The light-emitting component as claimed in claim 1, wherein the IC chip comprises at least two projections at its side surfaces extending along a primary plane of extension.

6. A display device comprising a plurality of light-emitting components as claimed in claim 1, wherein the light-emitting components are arranged in accordance with a periodic grid at its node points on a common carrier.

7. A method for the manufacture of the display device as claimed in claim 6, wherein the method comprises:
manufacturing the plurality of LED chips;
manufacturing a plurality of IC chips;
applying the plurality of LED chips to a top surface of the plurality of IC chips to form a plurality of light-emitting components;
selecting the light-emitting components; and
transferring the light-emitting components to a carrier of the display device.

8. The method according to claim 7, further comprising testing the light-emitting components.

9. The method as claimed in claim 7, wherein the applying the plurality of LED chips occurs by a stamping process.

10. The method as claimed in claim 7, further comprising transferring multiple light-emitting components by a stamping process.

11. The method as claimed in claim 7, wherein the transferring of the light-emitting components occurs before the selecting the light-emitting components.

12. The method as claimed in claim 7, wherein the selecting the light-emitting components and the transferring the light-emitting components to the carrier of the display device occurs simultaneously.

13. The method as claimed in claim 7, wherein manufacturing the IC chips occurs on a sacrificial layer that is removed before transferring the light-emitting components to the carrier of the display device.

14. The method as claimed in claim 7, wherein:
the manufacturing the IC chips occurs as a group in by rigidly mechanically bonding the IC chips to a common anchoring structure by means of projections, wherein the projections extend along the primary plane of extension of the IC chips; and
the common anchoring structure completely surrounds each IC chip of the plurality of IC chips in their primary plane of extension.

15. The method as claimed in claim 8, wherein:
an anchoring structure is provided with contact surfaces;
the contact surfaces are each electrically conductively connected with the plurality of LED chips are arranged on different IC chips; and
the light-emitting components are electrically operated through the contact surfaces during the applying of the plurality of LED chips to the top surface of the plurality of IC chips.

16. The light-emitting component of claim 1, wherein the plurality of LED chips is arranged directly on a top surface of the IC chip.

17. The light-emitting component of claim 1, wherein the plurality of LED chips are arranged on a common connecting region and are electrically conductively connected to the common connecting region; wherein each LED chip of the plurality of LED chips is electrically conductively contacted to a further connecting region separate from another further connecting region of another LED chip of the plurality of LED chips.

* * * * *